(12) United States Patent
Paek et al.

(10) Patent No.: US 11,538,895 B2
(45) Date of Patent: Dec. 27, 2022

(54) DISPLAY APPARATUS INCLUDING LINK LINE PORTION

(71) Applicant: LG Display Co., Ltd., Seoul (KR)

(72) Inventors: SeungHan Paek, Paju-si (KR); Kyungjae Yoon, Paju-si (KR); HyunJin An, Paju-si (KR); Seongwoo Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 95 days.

(21) Appl. No.: 17/134,815

(22) Filed: Dec. 28, 2020

(65) Prior Publication Data
US 2021/0202669 A1 Jul. 1, 2021

(30) Foreign Application Priority Data
Dec. 31, 2019 (KR) .......................... 10-2019-0180114

(51) Int. Cl.
| | |
|---|---|
| *H01L 27/32* | (2006.01) |
| *H01L 27/14* | (2006.01) |
| *H01L 51/00* | (2006.01) |
| *H01L 51/52* | (2006.01) |
| *G02F 1/13* | (2006.01) |
| *G06F 1/16* | (2006.01) |
| *G02F 1/1333* | (2006.01) |
| *H01L 27/146* | (2006.01) |
| *G09F 9/30* | (2006.01) |

(52) U.S. Cl.
CPC ...... *H01L 27/3276* (2013.01); *H01L 51/0097* (2013.01); *H01L 51/5253* (2013.01); *G02F 1/133331* (2021.01); *G06F 1/1641* (2013.01); *G06F 1/1652* (2013.01); *G09F 9/301* (2013.01); *G09G 2300/0408* (2013.01); *G09G 2300/0804* (2013.01); *H01L 27/14678* (2013.01); *H01L 27/323* (2013.01); *H01L 51/5246* (2013.01); *H01L 2251/301* (2013.01); *H01L 2251/5338* (2013.01)

(58) Field of Classification Search
CPC . H01L 27/3276; H01L 27/3244; H01L 27/32; H01L 27/323; H01L 27/14678; H01L 51/0097; H01L 51/5253; H01L 51/0096; H01L 51/5246; H01L 2251/5338; H01L 2251/301; G02F 1/133331; G02F 2001/133357; G06F 1/1652; G06F 1/1641; G09G 2300/0408; G09G 2300/0804
See application file for complete search history.

(56) References Cited

U.S. PATENT DOCUMENTS

| | | | |
|---|---|---|---|
| 10,700,311 B2 * | 6/2020 | Kwon | ..................... H01L 51/52 |
| 11,036,071 B2 * | 6/2021 | Um | ................... G02F 1/133305 |
| 2015/0014644 A1 * | 1/2015 | Namkung | ............... H01L 51/56 |
| | | | 438/42 |

(Continued)

*Primary Examiner* — Ida M Soward
(74) *Attorney, Agent, or Firm* — Morgan, Lewis & Bockius LLP

(57) ABSTRACT

A display apparatus includes a display area, a non-display area surrounding the display area, and a bending area formed in at least one side of the non-display area. The display apparatus includes a first glass substrate provided in the display area, a second glass substrate provided in the non-display area, an anti-etching member provided to overlap the bending area, and a link line portion formed on the anti-etching member and formed to overlap the non-display area.

14 Claims, 14 Drawing Sheets

(56) References Cited

U.S. PATENT DOCUMENTS

| | | | | |
|---|---|---|---|---|
| 2017/0271616 | A1* | 9/2017 | Choi | H01L 51/0097 |
| 2018/0013095 | A1* | 1/2018 | Choi | H01L 51/5253 |
| 2018/0067522 | A1* | 3/2018 | Namkung | G06F 1/1652 |
| 2018/0248140 | A1* | 8/2018 | Sano | H01L 51/0097 |
| 2019/0324567 | A1* | 10/2019 | Hong | H01L 51/5281 |
| 2019/0340959 | A1* | 11/2019 | Park | H01L 27/322 |
| 2020/0004295 | A1* | 1/2020 | Paek | G06F 1/1641 |
| 2020/0111992 | A1* | 4/2020 | Kwon | G02F 1/133305 |
| 2020/0136066 | A1* | 4/2020 | Jin | H01L 51/5253 |
| 2020/0136069 | A1* | 4/2020 | Paek | B32B 3/28 |
| 2020/0209925 | A1* | 7/2020 | Paek | G09F 9/301 |
| 2020/0365829 | A1* | 11/2020 | Sung | H01L 51/0097 |

* cited by examiner

DISPLAY APPARATUS INCLUDING LINK LINE PORTION

CROSS-REFERENCE TO RELATED APPLICATIONS

This application claims the benefit of the Korean Patent Application No. 10-2019-0180114 filed on Dec. 31, 2019 which is hereby incorporated by reference as if fully set forth herein.

BACKGROUND

Technical Field

The present disclosure relates to a display apparatus.

Discussion of the Related Art

Generally, a display apparatus is widely used as a display screen of various electronic devices such as a mobile communication terminal, an electronic diary, an electronic book, a portable multimedia player (PMP), a navigator, an Ultra Mobile PC (UMPC), a mobile phone, a smart phone, a tablet personal computer (PC), a watch phone, an electronic pad, a wearable device, a watch phone, a portable information device, a vehicle control display device, a television, a notebook computer, and a monitor.

Recently, studies and development of a display apparatus that may embody a maximum screen by reducing a bezel area where an image is not displayed in a size of the same display panel are ongoing.

For bezel bending, a laser lift off process is applied to a display apparatus to which a conventional glass substrate is applied, whereby problems occur in that a defect caused by the laser lift off process may occur and a manufacturing cost is increased.

SUMMARY

The inventors of the present disclosure have continuously studied and developed technologies that can replace a laser release process, and have invented a display apparatus of a new structure, which may be manufactured without the laser release process.

Accordingly, embodiments of the present disclosure are directed to a display apparatus that substantially obviates one or more of the problems due to limitations and disadvantages of the related art.

An aspect of the present disclosure is to provide a display apparatus in which reliability is improved and a width of a bezel area may be minimized.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus comprises a display area, a non-display area surrounding the display area, and a bending area formed in at least one side of the non-display area, wherein the display apparatus may comprise a first glass substrate provided in the display area, a second glass substrate provided in the non-display area, an anti-etching member provided to overlap the bending area, and a link line portion formed on the anti-etching member and formed to overlap the non-display area.

In another aspect, a display apparatus comprises a display area, a non-display area surrounding the display area, and a bending area formed in at least one side of the non-display area, wherein the display apparatus may comprise a first glass substrate provided in the display area, a second glass substrate provided in the non-display area, an anti-etching member provided to overlap the bending area, a first planarization layer provided to cover the anti-etching member, a link line portion partially arranged on the first planarization layer, and a second planarization layer provided to cover the link line portion and the first planarization layer.

The present disclosure may provide a display apparatus that may be manufactured without a laser lease process for a glass substrate. Also, the present disclosure may provide a display apparatus in which reliability is improved and a width of a bezel area may be minimized.

In the display apparatus according to one embodiment of the present disclosure, since a flexible substrate is not arranged in an area corresponding to a display area, luminance and residual image characteristics of the display area due to the flexible substrate may be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
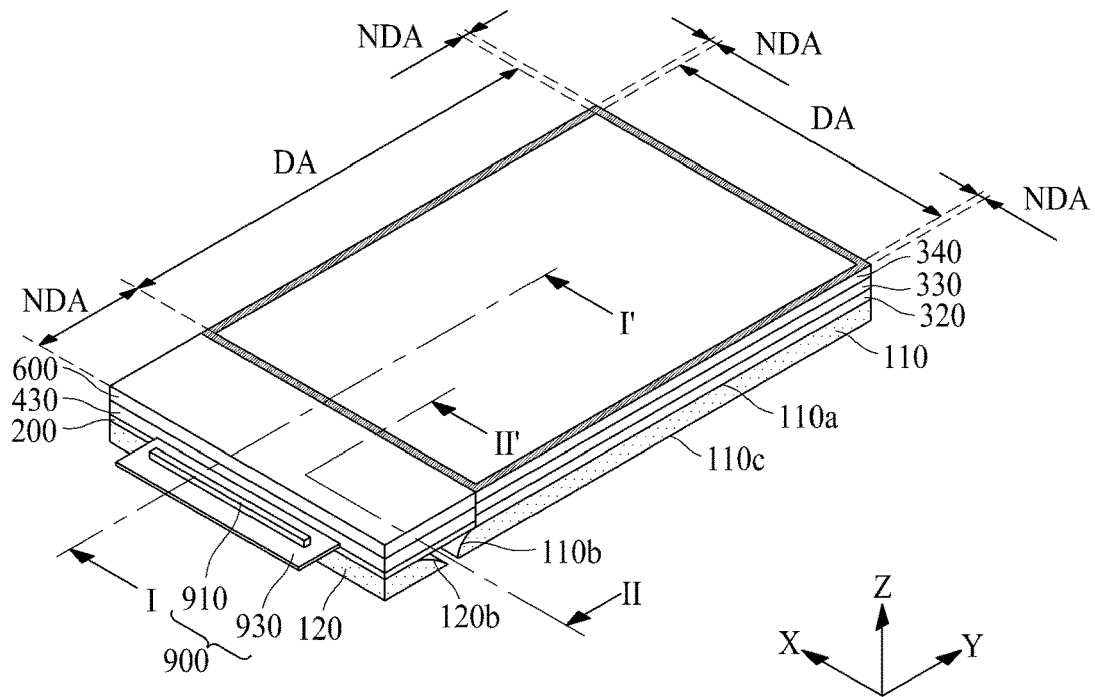
FIG. 1 is a perspective view illustrating a display apparatus according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~' 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display apparatus according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
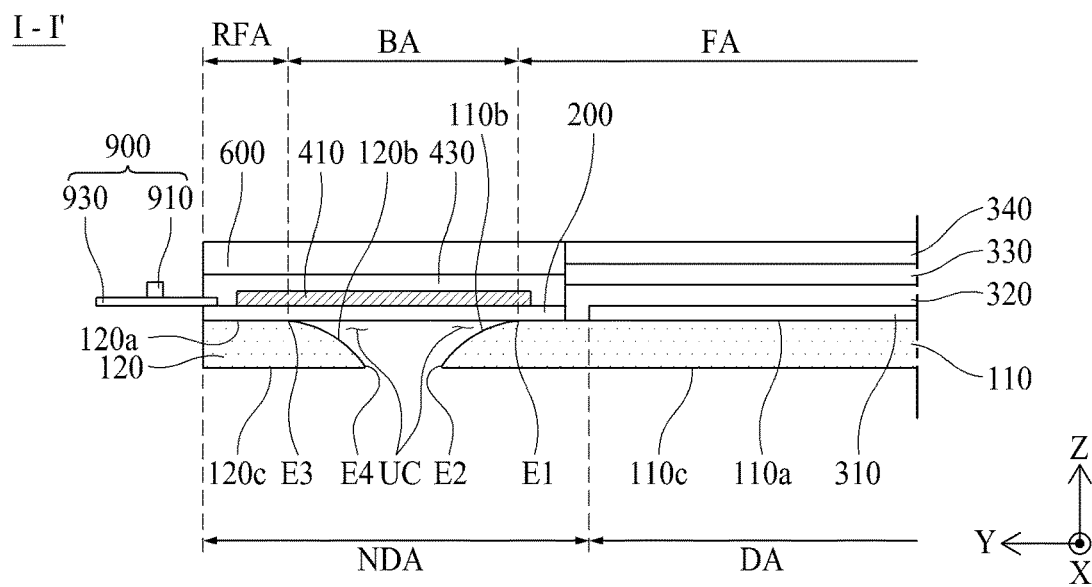
FIG. 2 is a cross-sectional view taken along line I-I' shown in FIG. 1.

FIG. 1 is a perspective view illustrating a display apparatus according to one embodiment of the present disclosure, and FIG. 2 is a cross-sectional view taken along line I-I' shown in FIG. 1.

Referring to FIGS. 1 and 2, the display apparatus according to one embodiment of the present disclosure comprises a display area, a non-display area surrounding the display area, and a bending area formed in at least one side of the non-display area.

The display area DA is an area where an image is displayed, and may include a plurality of pixels. The display area DA may be supported by a first flat surface 110a of a first glass substrate 110. The plurality of pixels may be arranged in the form of matrix, each of the pixels may include subpixels. The display area DA may substantially have a rectangular shape. However, embodiments of the present disclosure are not limited to the rectangular shape, and the display area DA may have a random polygonal shape. For example, the display area DA may have a triangle, a pentagonal shape and a hexagonal shape in accordance with a shape of the display apparatus. In the present disclosure, for convenience of description, the display area DA having a rectangular shape according to the display apparatus of a rectangular shape will be described.

The non-display area NDA is an area surrounding the display area DA, and elements and circuit lines for driving the display area DA may be arranged in the non-display area NDA.

A bending area BA may be defined as an area provided such that the display apparatus is partially bent. Therefore, the display apparatus according to one embodiment of the present disclosure may bent to have a certain curvature radius in accordance with bending of the bending area BA.

Also, in the display apparatus according to one embodiment of the present disclosure, a flat area FA, a bending area BA, and a rear flat area RFA may be defined. In this case, since the bending area BA is the same as the aforementioned bending area, its description will be omitted.

The flat area FA may be defined as an area overlapped with the first flat surface 110a of the first glass substrate 110. Also, the flat area FA may be an area that includes a predetermined non-display area NDA overlapped with the display area DA, surrounding the display area DA.

The rear flat area RFA may be defined as an area which is overlapped with a second flat surface 120a of a second glass substrate 120 and not overlapped with the bending area BA. The rear flat area RFA may be provided with a panel driving circuit 900.

Also, the display apparatus according to one embodiment of the present disclosure comprises a first glass substrate 110 provided in the display area DA, a second glass substrate 120 provided in the non-display area NDA, an anti-etching member 200 provided to overlap the bending area BA, and a link line portion 410 formed on the anti-etching member 200 and formed to overlap the non-display area NDA.

The first glass substrate 110 may include a first etching surface 110b provided to overlap the bending area BA. In this case, the case that the first etching surface 110b is overlapped with the bending area BA may mean that the first etching surface 110b is headed for a rear surface of the anti-etching member 200 overlapped with the bending area BA. Also, if the bending area BA of the display apparatus is not provided with the first etching surface 110b, since the display apparatus cannot be bent, the bending area BA of the display apparatus may be defined to overlap the first etching surface 110b.

Also, the first glass substrate 110 may include a first flat surface 110a and a first etching surface 110b arranged at one side of the first flat surface 110a, and may further include a first rear surface 110c facing the first flat surface 110a.

Also, the first glass substrate 110 may be defined by a first end E1 which is a boundary between the first flat surface 110a and the first etching surface 110b and a second end E2 which is a boundary between the first etching surface 110b and the first rear surface 110c. An inclination of the first etching surface 110b may be defined by an inclined surface connecting the first end E1 with the second end E2. Referring to FIGS. 1 and 2, although the first etching surface 110b is shown to have a convex curved surface, the embodiment of the present disclosure is not limited to this example. Various shapes of the first etching surface 110b will be described later with reference to FIGS. 5 and 6.

The second glass substrate 120 may include a second etching surface 120b provided to overlap the bending area BA. In this case, the case that the second etching surface 120b is overlapped with the bending area BA may mean that the second etching surface 120b is headed for the rear surface of the anti-etching member 200 overlapped with the bending area BA. Also, if the bending area BA of the display apparatus is not provided with the second etching surface 120b, since the display apparatus cannot be bent, the bending area BA of the display apparatus may be defined to overlap the second etching surface 120b.

Also, the second glass substrate 120 may include a second flat surface 120a and a second etching surface 120b arranged at one side of the second flat surface 120a, and may further include a second rear surface 120c facing the second flat surface 120a.

Also, the second glass substrate 120 may be defined by a third end E3 which is a boundary between the second flat surface 120a and the second etching surface 120b and a fourth end E4 which is a boundary between the second etching surface 120b and the second rear surface 120c. An inclination of the second etching surface 120b may be defined by an inclined surface connecting the third end E3 with the fourth end E4. Referring to FIGS. 1 and 2, although the second etching surface 120b is shown to have a convex curved surface, the embodiment of the present disclosure is not limited to this example. Various shapes of the second etching surface 120b will be described later with reference to FIGS. 5 and 6. A pad area may be provided in the second flat surface 120a of the second glass substrate 120, and may be provided with a panel driving circuit 900.

The first glass substrate 110 and the second glass substrate 120 may include a glass material. The first glass substrate 110 and the second glass substrate 120 according to one example may have a thickness of 0.01 mm to 1.0 mm to maintain flatness of the first flat surface 110a and the second flat surface 120a or shield water or oxygen from being permeated into the display apparatus. However, the thickness of the first glass substrate 110 and the second glass substrate 120 is not limited to the above example, and may be changed depending on a design condition of the display apparatus.

Also, if the first etching surface 110b of the first glass substrate 110 and the second etching surface 120b of the second glass substrate 120 are formed as shown in FIG. 2, the etching surfaces may be considered to have an undercut UC structure or an inverse tapered shape. In this case, the undercut UC may mean that the first end E1 and the third end E3 are formed to be wider than an opening pattern for etching when it is assumed that the second end E2 and the fourth end E4 correspond to the opening pattern. A detailed structure of the first etching surface 110b of the first glass substrate 110 and the second etching surface 120b of the second glass substrate 120 will be described later with reference to FIGS. 5 and 6.

The anti-etching member 200 may be arranged to overlap the bending area BA. For example, the anti-etching member 200 may be arranged to overlap only the bending area BA.

The anti-etching member 200 may be an element for preventing the display apparatus overlapped with the first etching surface 110b and the second etching surface 120b from being damaged by etching when an etching process required to prepare the first glass substrate 110 and the second glass substrate 120 according to one embodiment of the present disclosure is performed. Therefore, the anti-etching member 200 may be arranged to overlap the bending area BA of the display apparatus.

Also, the anti-etching member 200 may include the bending area BA, and may be overlapped with the first flat surface 110a of the first glass substrate 110 extended to one side of the bending area BA and overlapped with the second flat surface 120a of the second glass substrate 120 extended to the other side of the bending area BA.

In this case, the anti-etching member 200 may be made of an organic matter based material, specifically a material having resistance to a glass etching solution. For example, as the etching solution for glass etching, an etching solution that includes hydrofluoric acid HF or nitric acid $HNO_3$ may be used, and glass etching may be a wet etching process. The anti-etching member 200 may include at least one of silicone based organic matter, urethane, polyimide, and photo acryl.

The anti-etching member 200 is to protect an element arranged thereon during a process of forming the first etching surface 110b and the second etching surface 120b of the first glass substrate 110 and the second glass substrate 120. The anti-etching member 200 may have a size wider than the area overlapped with the first etching surface 110b and the second etching surface 120b of the first glass substrate 110 and the second glass substrate 120, or may have a size wider than the bending area BA.

The anti-etching member 200 according to one example may prevent the display apparatus from being damaged by the etching solution used for the glass etching process of forming the first etching surface 110b and the second etching surface 120b of the first glass substrate 110 and the second glass substrate 120. The anti-etching member 200 may be made of a material having corrosion resistance (or tolerance) for the etching solution used for the glass etching process.

According to one example, the anti-etching member 200 may be prepared in the form of jetting a material to a position set by a mechanical manner such as a slit coater, an inkjet and a dispenser, or may be prepared by a patterning process using a photolithography mask.

In this way, as the display apparatus according to one embodiment of the present disclosure comprises the anti-etching member 200 arranged between the first and second etching surfaces 110b and 120b of the first and second glass substrates 110 and 120 overlapped with the bending area BA and the link line portion 410, the display apparatus may be prevented from being damaged by the glass etching process of forming the first and second etching surfaces 110b and 120b of the first and second glass substrates 110 and 120.

The anti-etching member 200 may be referred to as an etching stop pattern, an etching barrier pattern, an etching mask pattern, etc.

Also, considering a process margin based on etching in the process of forming the first and second etching surfaces 110b and 120b of the first and second glass substrates 110 and 120, the anti-etching member 200 may be formed to overlap even the area extended to one side and the other side of the bending area BA. In detail, the anti-etching member 200 may be formed to overlap the first flat surface 110a of the first glass substrate 110 and the second flat surface 120a of the second glass substrate 120 as much as a predetermined area. If the anti-etching member 200 is formed to be extended to one side and the other side of the bending area BA, stability for the etching process of forming the first and second etching surfaces 110b and 120b of the first and second glass substrates 110 and 120 may be improved.

Figure 4:
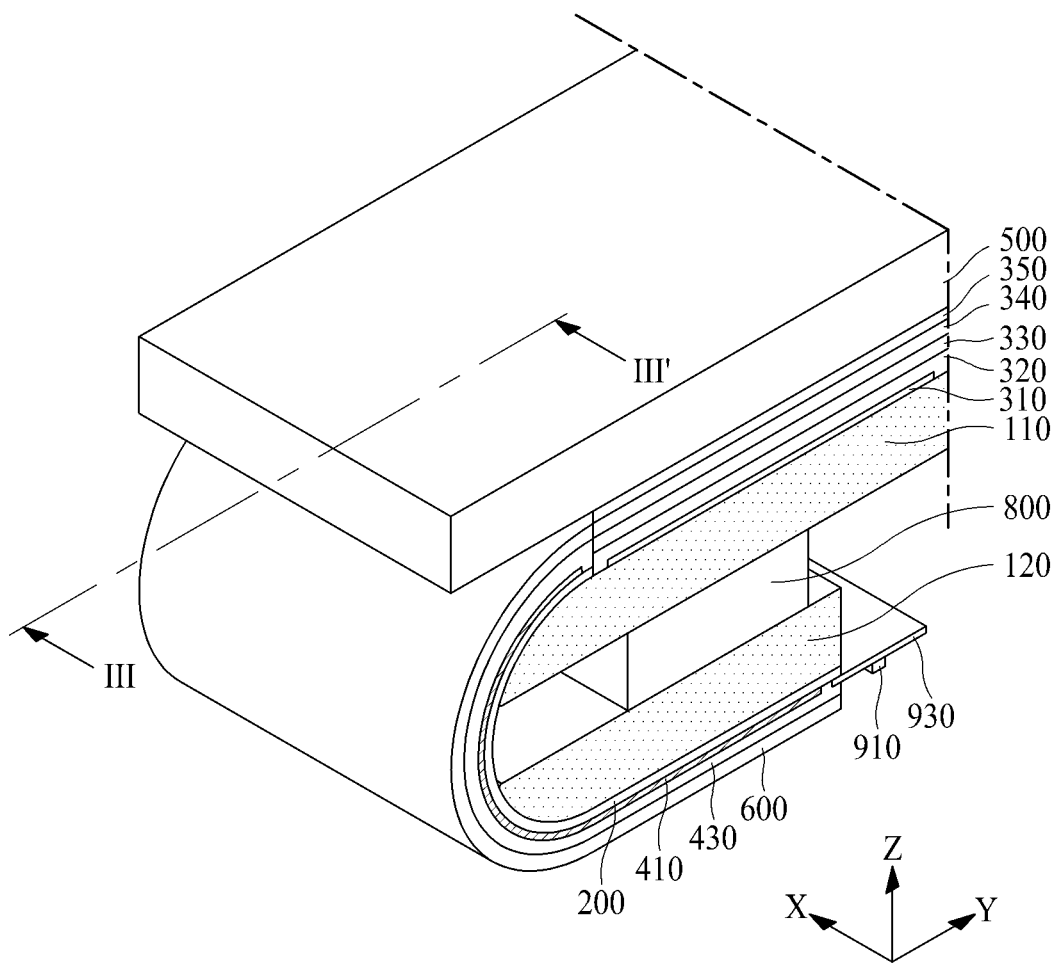
FIG. 4 is a perspective view illustrating a display apparatus according to one embodiment of the present disclosure.

Also, as shown in FIG. 4, the display apparatus according to one embodiment of the present disclosure may further comprise an adhesive member 800 for fixing the first rear surface 110c of the first glass substrate 110 to the second rear surface 120c of the second glass substrate 120 if the bending area BA is bent such that the first rear surface 110c of the first glass substrate 110 is provided to face the second rear surface 120c of the second glass substrate 120.

The adhesive member 800 may be, but not limited to, an optically clear adhesive (OCA), an optically clear resin (OCR), a pressure sensitive adhesive (PSA), a double side adhesive, or a double side tape.

The first glass substrate 110 may include the first flat surface 110a and the first etching surface 110b arranged at one side of the first flat surface 110a, and may further include the first rear surface 110c facing the first flat surface 110a.

The first flat surface 110a of the first glass substrate 110 may be overlapped with the display area DA and the flat area FA of the display apparatus.

The first glass substrate 110 is a base substrate of the display area DA, and elements corresponding to the display area DA that includes the pixel array layer 310, which will be described later, may be arranged on the first glass substrate 110.

The first etching surface 110b of the first glass substrate 110 may be formed to overlap the anti-etching member 200.

The first etching surface 110b may be formed in the other portion except for the first flat surface 110a from the upper surface where the first glass substrate 110 is overlapped with the display area DA and the bending area DA. According to the present disclosure, the etching process may be performed for the first glass substrate 110 having a flat panel type to partially remove (or etch) the first flat surface 110a, whereby the first etching surface 110b may be formed in a streamlined type convex sectional shape while having a non-flat structure. Also, the first etching surface 110b may be provided to have a surface continuous with the first flat surface 110a.

The first etching surface 110b of the first glass substrate 110 and the second etching surface 120b of the second glass substrate 120 may have an inverse tapered shape and a curved surface, and may be provided to be in contact with the anti-etching member 200. A detailed structure of the bending area BA that includes the first etching surface 110b of the first glass substrate 110 and the second etching surface 120b of the second glass substrate 120 will be described later with reference to FIGS. 4 to 6.

Also, the display apparatus according to one embodiment of the present disclosure may further comprise a pixel array layer 310, an overcoat layer 320, a touch sensor layer 330 and a functional film 340, which are sequentially formed on the first flat surface 110a of the first glass substrate 110 of the display area DA.

The pixel array layer 310 includes a plurality of pixels provided in a pixel area defined by pixel driving lines provided on the display area DA, displaying an image in accordance with a signal supplied to the pixel driving lines. In this case, the pixel driving lines may include data lines, gate lines and pixel driving power sources. Each of the pixels may include a pixel circuit layer, an anode electrode layer, a self-light emitting diode layer, and a cathode electrode layer.

The pixel array layer 310 according to one embodiment of the present disclosure may directly be formed on the first glass substrate 110 without a sacrificial layer, an inter-layer dielectric layer or a buffer layer.

The pixel circuit layer is provided in a transistor area of each pixel area and driven in accordance with a signal supplied from adjacent pixel driving lines to control light emission of the self-light emitting diode layer. The pixel circuit layer according to one example may include at least two thin film transistors that include a driving thin film transistor provided in the transistor area of each pixel area defined on the first glass substrate 110 and at least one capacitor. In this case, the pixel circuit layer may include at least one TFT of an amorphous thin film transistor (a-Si TFT), a polysilicon thin film transistor (poly-Si TFT), an oxide TFT, and an organic TFT. The anode electrode layer may electrically be connected with the driving thin film transistor.

The self-light emitting diode layer is formed on the anode electrode layer provided in an opening area of each pixel. In this case, the opening area of each pixel area may be defined by a bank pattern formed on the overcoat layer to cover edges of the anode electrode layer.

The self-light emitting diode layer according to one example may include an organic light emitting diode, a quantum dot light emitting diode, or an inorganic light emitting diode. For example, the self-light emitting diode layer may be formed in a deposited structure of a hole injecting layer, a hole transporting layer, an organic light emitting layer, an electron transporting layer, and an electrode injecting layer, which are sequentially deposited. In this case, one or two or more of the hole injecting layer, the hole transporting layer, the electron transporting layer and the electron injecting layer may be omitted. The organic light emitting layer may be formed to emit light of the same color per pixel, for example, white light, or may be formed to emit light of different colors per pixel, for example, red light, green light, or blue light.

The cathode electrode layer is formed on the first glass substrate 110 to be commonly connected to the self-light emitting diode layer provided in each pixel area.

Also, the pixel array layer 310 may further include a pad portion and a gate driving circuit.

The pad portion may include a plurality of pad electrodes provided at an edge of at least one side of the first glass substrate 110. Each of the plurality of pad electrodes is electrically connected with the pixel driving lines provided in the pixel array layer 310 through each of a plurality of link lines, and is electrically connected with the gate driving circuit. The pad portion is electrically connected with the panel driving circuit 900 and supplies the signal supplied from the panel driving circuit 900 to the pixel driving lines and the gate driving circuit provided in the pixel array layer 310 through the link line portion 410.

The gate driving circuit may be provided at left and/or right edges of the first glass substrate 110 to be connected with one end and/or the other end of each of the plurality of gate lines. The gate driving circuit generates a gate signal in response to a gate control signal supplied through the pad portion and supplies the generated gate signal to each of the plurality of gate lines. The gate driving circuit may be, but not limited to, a gate built-in circuit formed together with the manufacturing process of the thin film transistor of each pixel.

The overcoat layer 320 is formed on the first glass substrate 110 to surround the pixel array layer 310. The overcoat layer 320 may be formed to protect the pixel array layer 310 from external impact, and may serve to prevent oxygen and/or water and particles from being permeated into the pixel array layer 310. The overcoat layer 320 may be referred to as an encapsulation layer.

The overcoat layer 320 according to one example may include at least one inorganic film. The overcoat layer 320 may further include at least one organic film. For example, the overcoat layer 320 may include a first inorganic encapsulation layer, an organic encapsulation layer and a second inorganic encapsulation layer. The first and second inorganic encapsulation layers may include at least one inorganic material of silicon oxide SiOx, silicon nitride SiNx, silicon oxynitride SiON, titanium oxide TiOx and aluminium oxide AlOx. The organic encapsulation layer may be made of any one organic material of acryl resin, epoxy resin, phenolic resin, polyamide resin, polyimide resin, and benzocyclobutene resin. The organic encapsulation layer may be expressed as a particle cover layer.

The touch sensor layer 330 may be provided on an upper surface of the overcoat layer 320. The touch sensor layer includes a mutual capacitance type or self-capacitance type touch sensor or touch electrode having a change of capacitance generated in accordance with a user's touch.

The functional film 340 is provided on the touch sensor layer 330 and improves optical characteristics of the display apparatus by polarizing light emitted from each pixel of the pixel array layer 310 or preventing external light from being reflected. For example, the functional film 340 improves visibility and a contrast ratio of the display apparatus by changing external light reflected by a thin film transistor and/or lines provided in each pixel to a circular polarizing state. For example, the functional film 340 according to one example may include a circular polarizer. Optionally, a polarizing layer may be formed in a film type that includes a circular polarizer and attached onto the touch sensor layer by an adhesive.

Also, the display apparatus according to one embodiment of the present disclosure may further comprise a first planarization layer 430 arranged in the non-display area on the link line portion 410, and a micro coating layer 600 covering the first planarization layer 430.

The link line portion 410 may be, but limited to, one of a data link line and a gate link line.

According to one example, the link line portion 410 may be formed of a material having excellent flexibility and conductivity to reduce occurrence of a crack during bending of the bending area BA. For example, the link line portion 410 may be formed of the same conductive material as that of a source electrode or drain electrode of a thin film transistor constituting the pixel array layer 310 by the same process, but may be formed of another material without limitation to the above example.

The first planarization layer 430 may be formed of the same material as that of a planarization layer constituting the pixel array layer 310 of the display area DA by the same process and identified from the planarization layer by patterning, but may be formed of another material without limitation to the above example. The first planarization layer 430 may be made of an organic based insulating material such as photo acryl or BCB.

The micro coating layer 600 may be formed on the first glass substrate 110, the second glass substrate 120, the link line portion 410 and the anti-etching member 200 of the bending area BA and the rear flat surface RFA.

The micro coating layer 600 may serve to protect a line by forming a resin in a bending position at a thin thickness because a crack may occur due to a tensile force acting on the link line portion 410 arranged on the anti-etching member 200 during bending. The micro coating layer 600 may be made of an acryl based material such as acrylate polymer.

The micro coating layer 600 may control a neutral plane of the bending area BA. The neutral plane may mean a virtual plane to which a stress is not applied as a compressive force and a tensile force applied to a structure are counterbalanced when the structure is bent. If two or more structures are deposited, a virtual neutral plane may be formed between the structures. If the structures are bent in one direction, the structures arranged in a bending direction based on the neutral plane are compressed by bending, whereby a compressive force is applied to the structures. On the contrary, the structures arranged in an opposite direction of the bending direction based on the neutral plane are stretched by bending, whereby a tensile force is applied to the structures. Since the structures are more vulnerable to the tensile force than the compressive force, it is likely that a crack may occur when the tensile force is applied to the structures.

Since the anti-etching member 200 arranged at a lower portion based on the neutral plane is compressed, the compressive force may be applied to the anti-etching member 200, and the tensile force may be applied to the link line portion 410 arranged at an upper portion, whereby a crack may occur due to the tensile force. Therefore, the line may be arranged on the neutral plane to minimize the tensile force applied to the line.

The micro coating layer 600 may be arranged on the bending area BA to ascend the neutral plane in an up direction, and the neutral plane may be formed at the same positon as the line or the line may be arranged to be higher than the neutral plane, whereby a stress may not be applied or a compressive force may be applied during bending to reduce occurrence of a crack.

The panel driving circuit 900 may be packaged in the second glass substrate 120 to supply a signal for displaying an image to the pixel array layer 310. The panel driving circuit 900 according to one example may include a flexible circuit film 930 and a driving integrated circuit 910. The flexible circuit film 930 may be attached to one side of the first glass substrate 120 through a film attachment process.

The driving integrated circuit 910 is packaged in the flexible circuit film 930 by a chip bonding process or a surface packaging process. The driving integrated circuit 910 generates a data signal and a gate control signal based on a timing synchronizing signal and image data supplied from an external display driving system, supplies the data signal to the data line of each pixel and supplies the gate control signal to the gate driving circuit.

Optionally, the driving integrated circuit 910 may electrically be connected to the pad portion by being packaged in the second glass substrate 120 without being packaged in the flexible circuit film 930, and may electrically be connected to each of the pixel driving signal line and the gate driving circuit. In this case, the flexible circuit film 930 serves to relay signal transmission between the pad portion and the display driving system.

Figure 3A:
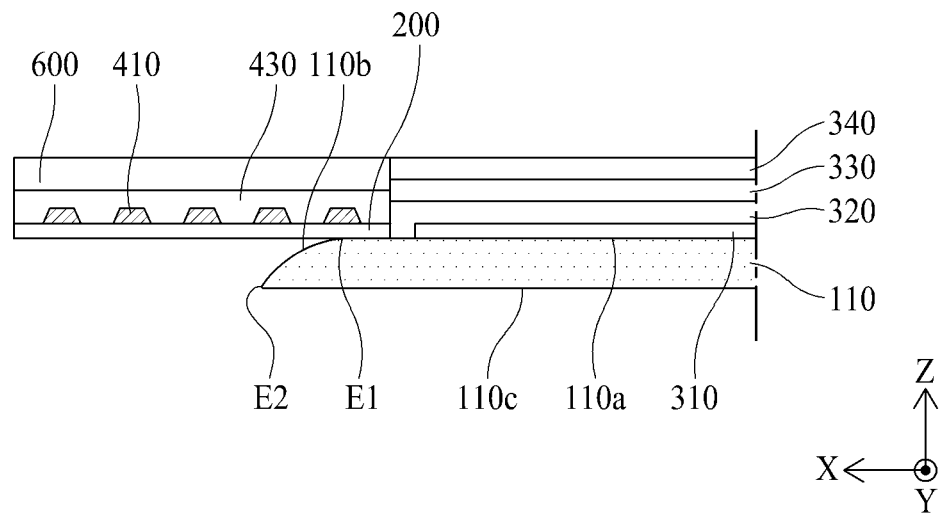
FIG. 3a is a cross-sectional view taken along line II-IF shown in FIG. 1.
Figure 3B:
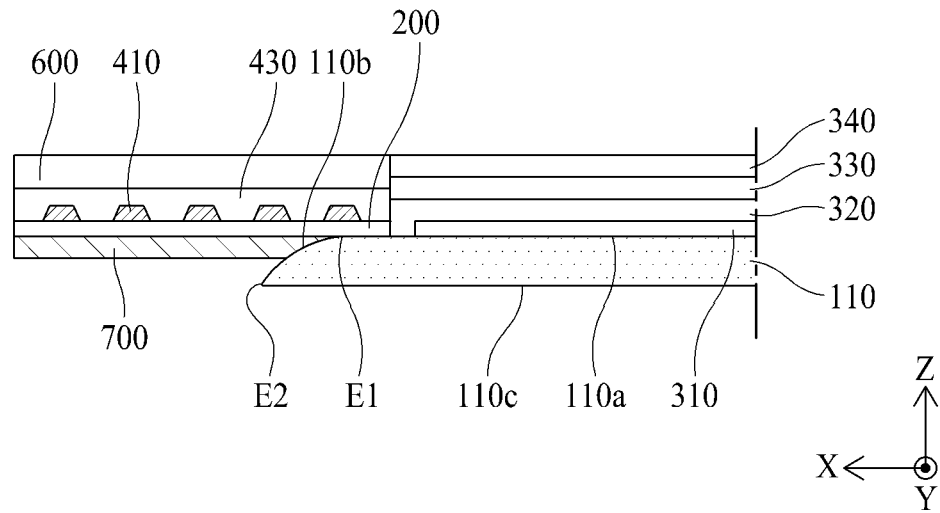
FIG. 3b is another cross-sectional view taken along line II-IF shown in FIG. 1.

FIG. 3*a* is a cross-sectional view taken along line II-IF shown in FIG. 1, and FIG. 3*b* is another cross-sectional view taken along line II-IF shown in FIG. 1. Since the display apparatus of FIGS. 3*a* and 3*b* is the same as the display apparatus described in FIGS. 1 and 2 except a cutting surface of the bending area BA, a repeated description will be omitted.

As shown in FIGS. 3*a* and 3*b*, the link line portion 410 may be formed on the anti-etching member 200 and spaced apart from another link portion at a predetermined interval, and the first planarization layer 430 may be arranged to cover the link line portion 410.

The first planarization layer 430 may be made of an organic based insulating material such as photo acryl or BCB. Also, the first planarization layer 430 may be prepared by the same process as the planarization layer used when the pixel array layer of the display area DA is formed, but the embodiment of the present disclosure is not limited to this example.

As shown in FIG. 3*b*, the display apparatus according to one embodiment of the present disclosure may further comprise an elastic member 700 arranged below the anti-etching member 200. In this case, the elastic member 700 may be used as the term such as a moisture proofing member, a filling member or an elongation member. The elastic member 700 may be arranged on the rear surface of the anti-etching member 200 overlapped with the bending area BA.

A material having an excellent moisture proofing characteristic may be used as the elastic member 700, for example, a material such as tuffy may be used as the elastic member 700. The elastic member 700 may be applied to be deposited on the rear surface of the anti-etching member 200, and may be formed to overlap the bending area BA.

The elastic member 700 may be filled (or buried) to overlap the first etching surface 110*b* of the first glass substrate 110, the second etching surface 120*b* of the second glass substrate 120 and the anti-etching member 200. The elastic member 700 may shield water or oxygen from being permeated into the display apparatus through the anti-etching member 200 adjacent to the first etching surface 110*b* of the first glass substrate 110 and the second etching surface 120*b* of the second glass substrate 120. Also, the elastic member 700 may prevent the anti-etching member 200 adjacent to the first etching surface 110*b* of the first glass substrate 110 and the second etching surface 120*b* of the second glass substrate 120 from being damaged during repeated bending (or folding) of the display apparatus.

Since the elastic member 700 is formed to overlap the anti-etching member 200 and the first etching surface 110*b* of the first glass substrate 110 and the second etching surface 120*b* of the second glass substrate 120 overlapped with the bending area BA of the display apparatus, a shape based on a width and thickness of the elastic member 700 may be set based on a position of the neutral plane based on a compressive stress and tensile stress applied to the bending area BA of the display apparatus during bending (or folding) of the bending area BA of the display apparatus.

The elastic member 700 according to one example may be formed in such a manner that a liquid resin, for example, organic resin is filled (or buried) in the anti-etching member 200 and the first etching surface 110*b* of the first glass substrate 110 and the second etching surface 120*b* of the second glass substrate through a jetting process or dispensing process and then hardened by photo-hardening process.

As the elastic member 700 is made of a liquid resin, the elastic member 700 may be filled (or permeated) into a gap between the anti-etching member 200 and the glass substrate 110 adjacent to the first etching surface 110*b* of the first glass substrate 110 and the second etching surface 120*b* of the second glass substrate 120. To this end, the elastic member 700 may include a material having a moisture proofing characteristic while having an adhesive characteristic, and may include an optical bond hardened by UV. For example, the elastic member 700 may include an acryl based or silicone based organic adhesive material. The elastic member 700 may have an elongation rate of 100% or more.

Also, as the display apparatus according to one embodiment of the present disclosure further comprises the elastic member 700 filled to overlap the anti-etching member 200 and the first etching surface 110*b* of the first glass substrate 110 and the second etching surface 120*b* of the second glass substrate 120, bending reliability of the display apparatus may be minimized or prevented from being deteriorated and reliability for water or oxygen may be more improved.

Consequently, the display apparatus according to one embodiment of the present disclosure may be manufactured even without a laser release process, and reliability for water or oxygen and bending reliability may be improved. Also, since the display apparatus provided with the bending area BA without a laser release process may be provided, productivity may be increased.

Figure 5A:
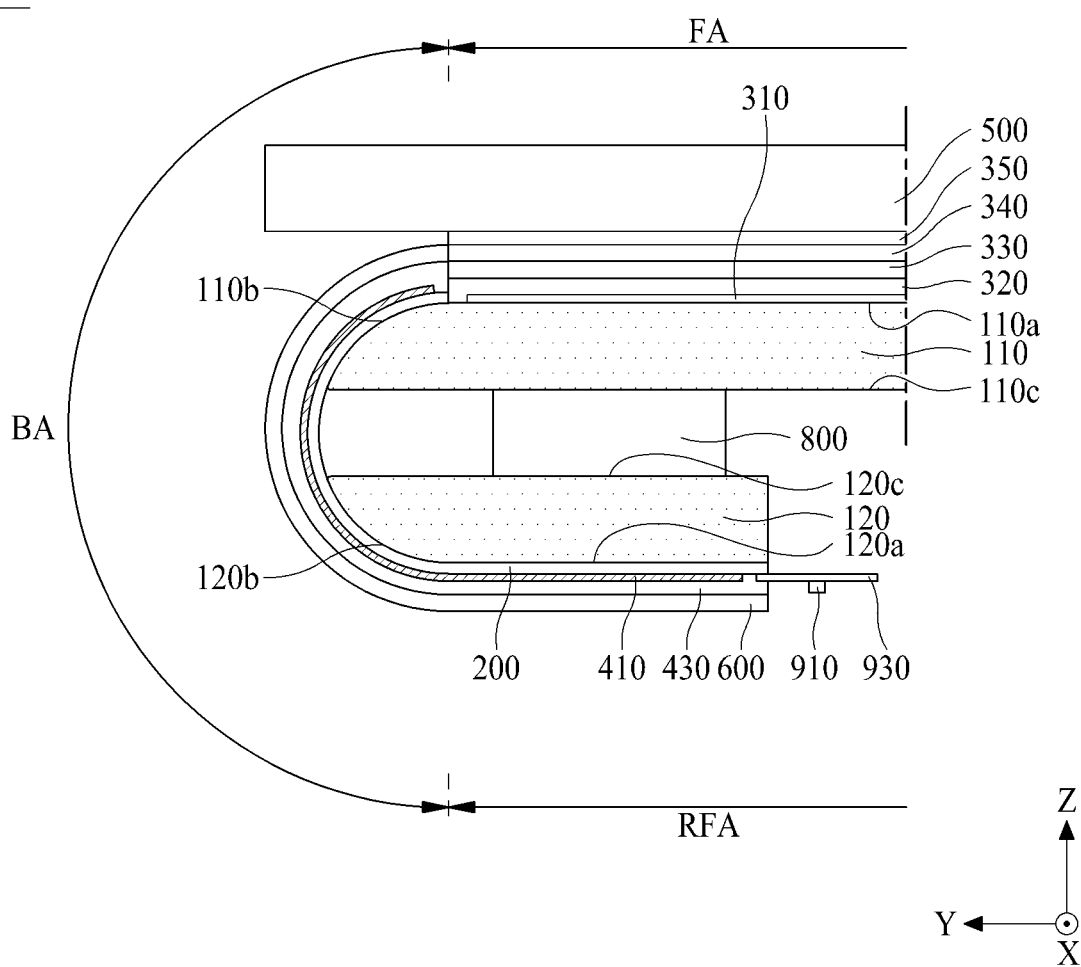
FIG. 5a is a cross-sectional view taken along line shown in FIG. 4.

FIG. 4 is a perspective view illustrating a display apparatus according to one embodiment of the present disclosure, and FIG. 5*a* is a cross-sectional view taken along line III-III' shown in FIG. 4. The display apparatus of FIGS. 4 and 5*a* inwardly bent at 180° is shown such that the second glass substrate 120 of the display apparatus in FIG. 1 is arranged on the rear surface of the first glass substrate 110.

As shown in FIGS. 4 and 5, the second glass substrate 120 may be bent toward an inner side of the display apparatus at 180°, and may be bent such that the second rear surface 120*c* of the second glass substrate 120 faces the first rear surface 110*c* of the first glass substrate 110. Also, the adhesive member 800 for fixing the second rear surface 120*c* of the second glass substrate 120 to the first rear surface 110*c* of the first glass substrate 110 may further be arranged between the second rear surface 120*c* of the second glass substrate 120 and the first rear surface 110*c* of the first glass substrate 110.

As the bending area is arranged to be bent on the first etching surface 110*b* on the first glass substrate 110 and the second etching surface 112*b* on the second glass substrate 120 by a glass etching process in a curved shape, the display apparatus according to one embodiment of the present disclosure may have a minimized bezel area. In more detail, as the first rear surface 110*c* of the first glass substrate 110 and the second rear surface 120*c* of the second glass substrate 120 are not arranged on the same line unlike the conventional display apparatus, the second rear surface 120*c* of the second glass substrate 120 has a bending structure to face the first rear surface 110*c* of the first glass substrate 110, whereby the display apparatus in which the non-display area NDA is minimized may be provided.

The first etching surface 110*b* of the first glass substrate 110 and the second etching surface 120*b* of the second glass substrate 120 according to one embodiment of the present disclosure may be formed by a glass etching process based on over etch condition. In this case, the over etch condition may be defined by a glass etching process performed for a reference etching time or more, which is set to etch a glass of a certain thickness.

The first etching surface 110b of the first glass substrate 110 and the second etching surface 120b of the second glass substrate 120 may be formed in such a manner that a mask pattern is formed on a rear surface of a glass substrate (not shown) overlapped with the other areas FA and RFA except the bending area BA and then an area of the glass substrate overlapped with the bending area BA is etched in an oblique shape by the glass etching process using the mask pattern as a mask based on the over etch condition. In this case, the glass substrate (not shown) means a glass substrate before the first glass substrate 110 and the second glass substrate 120 are detached from each other by the glass etching process.

The first etching surface 110b of the first glass substrate 110 and the second etching surface 120b of the second glass substrate 120 may be formed as inclined surfaces having a convex curved shape. In this case, cross sectional areas of the first etching surface 110b of the first glass substrate 110 and the second etching surface 120b of the second glass substrate 120 may be increased as these etching surfaces become far away from the first flat surface 110a and the second flat surface 120a. For example, the cross sectional areas of the first etching surface 110b of the first glass substrate 110 and the second etching surface 120b of the second glass substrate 120 may be defined by a size of a horizontal cutting surface cut based on a horizontal surface parallel with the first flat surface 110a and the second flat surface 120a. The first etching surface 110b and the second etching surface 120b may be designated to have an inverse tapered shape.

The display apparatus according to one embodiment of the present disclosure may further comprise an adhesive layer 350 arranged on the functional film 340 and a cover window 500 provided on the adhesive layer 350.

The adhesive layer 350 may include a pressure-sensitive adhesive, a foam-type adhesive, a liquid adhesive, a light-cured adhesive or another suitable adhesive material. In some embodiments, the adhesive layer 350 may be formed of a compressive material or include the compressive material and therefore may serve as a buffer member for a portion adhered by the adhesive layer 350. For example, the material of the adhesive layer 350 may be compressed. The adhesive layer 350 may be formed in a multi-layered structure that includes a buffer layer arranged between upper and lower layers of the adhesive material layer.

The cover window 500 may be arranged to cover a front surface of the display apparatus and the bending area BA, and may serve to protect the display apparatus from external impact. The cover window 500 according to one example may be made of a transparent material, a glass material or a reinforcing glass material.

Also, the display apparatus may further comprise an adhesive member 800 for fixing the first rear surface 110c of the first glass substrate 110 to the second rear surface 120c of the second glass substrate 120 but the adhesive member 800 may be omitted depending on a design of the display apparatus.

As shown in FIGS. 4 and 5, according to one embodiment of the present disclosure, the first etching surface 110b of the first glass substrate 110 and the second etching surface 120b of the second glass substrate 120, which are overlapped with the bending area BA, may be provided to be directly in contact with the anti-etching member 200. At this time, since the first etching surface 110b of the first glass substrate 110 and the second etching surface 120b of the second glass substrate 120 may guide bending of the anti-etching member 200 and the link line portion 410 of the bending area, these etching surfaces may be referred to as bending guide portions.

Figure 5B:
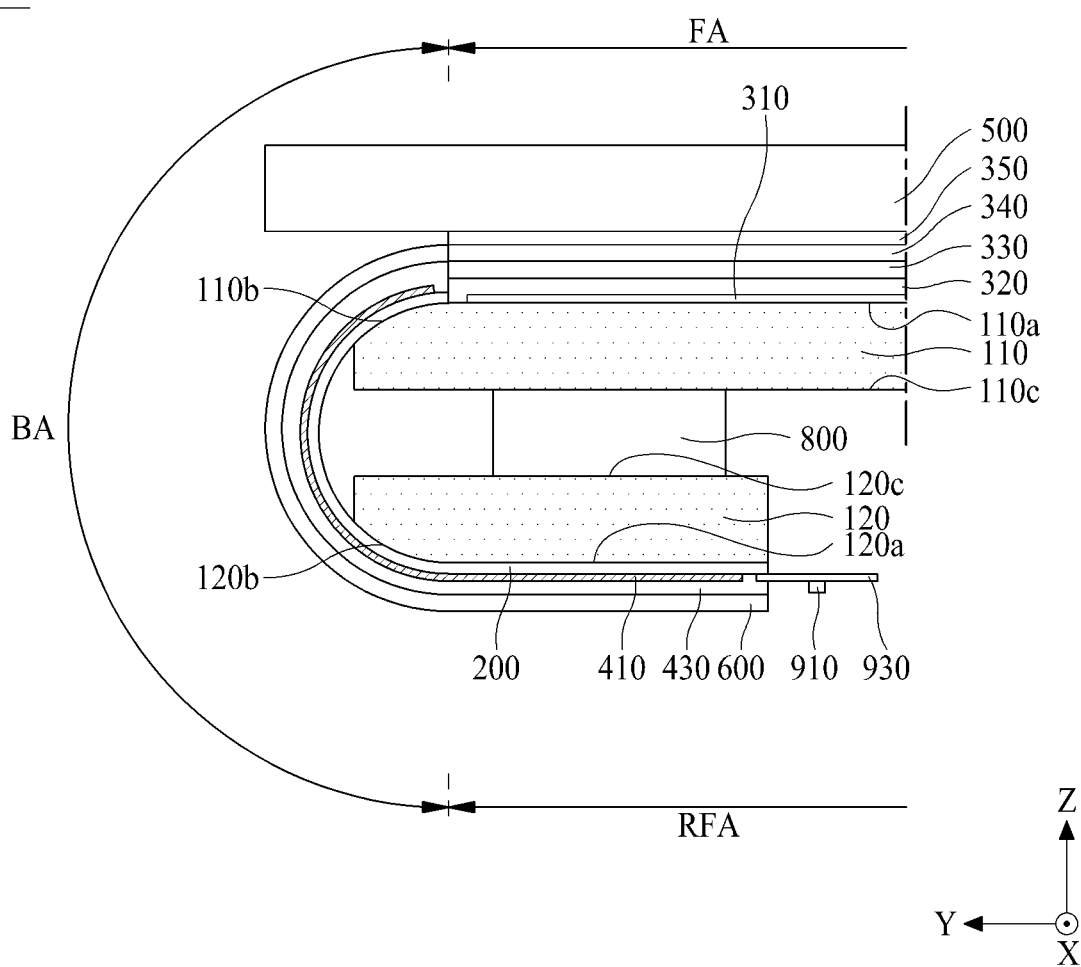
FIG. 5b is another cross-sectional view taken along line II-IF shown in FIG. 4.
Figure 5C:
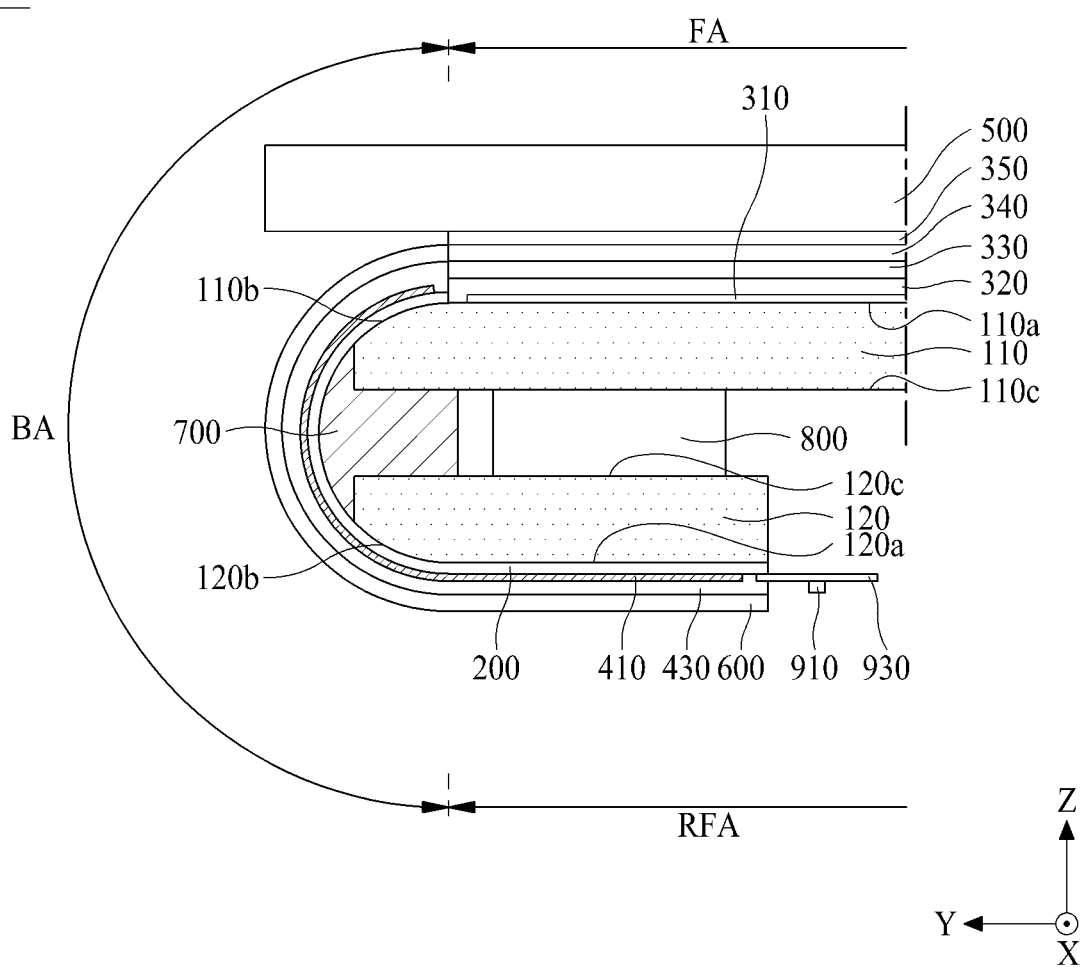
FIG. 5c is other cross-sectional view taken along line II-IF shown in FIG. 4.

FIG. 5b is another cross-sectional view taken along line II-IF shown in FIG. 4, and FIG. 5c is other cross-sectional view taken along line II-IF shown in FIG. 4. Since the display apparatus of FIGS. 5b and 5c are different from the display apparatus of FIG. 5a in view of shapes of the first etching surface 110b of the first glass substrate 110 and the second etching surface 120b of the second glass substrate 120, a repeated description will be omitted.

Referring to FIG. 5b, at least a portion of the first etching surface 110b of the first glass substrate 110 and the second etching surface 120b of the second glass substrate 120 has an inverse tapered shape or undercut UC structure, and may include a vertical etching surface substantially parallel with a third direction Z. A first direction X and a second direction Y may indicate random directions orthogonal to each other on a plane, and in the present disclosure, a direction parallel with a short side of the display apparatus based on FIG. 1 is defined as the first direction X, and a direction orthogonal to the first direction is defined as the second direction Y. Next, the third direction Z is defined as a direction vertical to a plane provided by the first direction X and the second direction Y.

Therefore, the display apparatus shown in FIG. 5b may be provided such that at least a portion of the first etching surface 110b of the first glass substrate 110 and the second etching surface 120b of the second glass substrate 120 is in contact with the anti-etching member 200 and at least a portion of the first etching surface 110b of the first glass substrate 110 and the second etching surface 120b of the second glass substrate 120 is not in contact with the anti-etching member 200. Therefore, in the display apparatus of FIG. 5b, the anti-etching member 200, the link line portion 410, the first planarization layer 430 and the micro coating layer 600, which are overlapped with the bending area BA, may be spaced apart from one another at a predetermined distance to have a degree of freedom.

As shown in a sectional view of FIG. 5c, if at least a portion of the first etching surface 110b of the first glass substrate 110 and the second etching surface 120b of the second glass substrate 120 is not in contact with the anti-etching member 200, the elastic member 700 may additionally be provided below the anti-etching member 200. Therefore, as the elastic member 700 is additionally provided below the anti-etching member 200, the elastic member 700 may support the anti-etching member 200 overlapped with the bending area BA. Since the elastic member 700 is the same as that described in FIG. 3b, its repeated description will be omitted. Also, although FIG. 5c shows that the elastic member 700 is not deposited between the first and second etching surfaces 110b and 120b and the anti-etching member 200, the elastic member 700 may be provided to fill a fine gap between the first and second etching surfaces 110b and 120b and the anti-etching member 200.

Figure 6A:
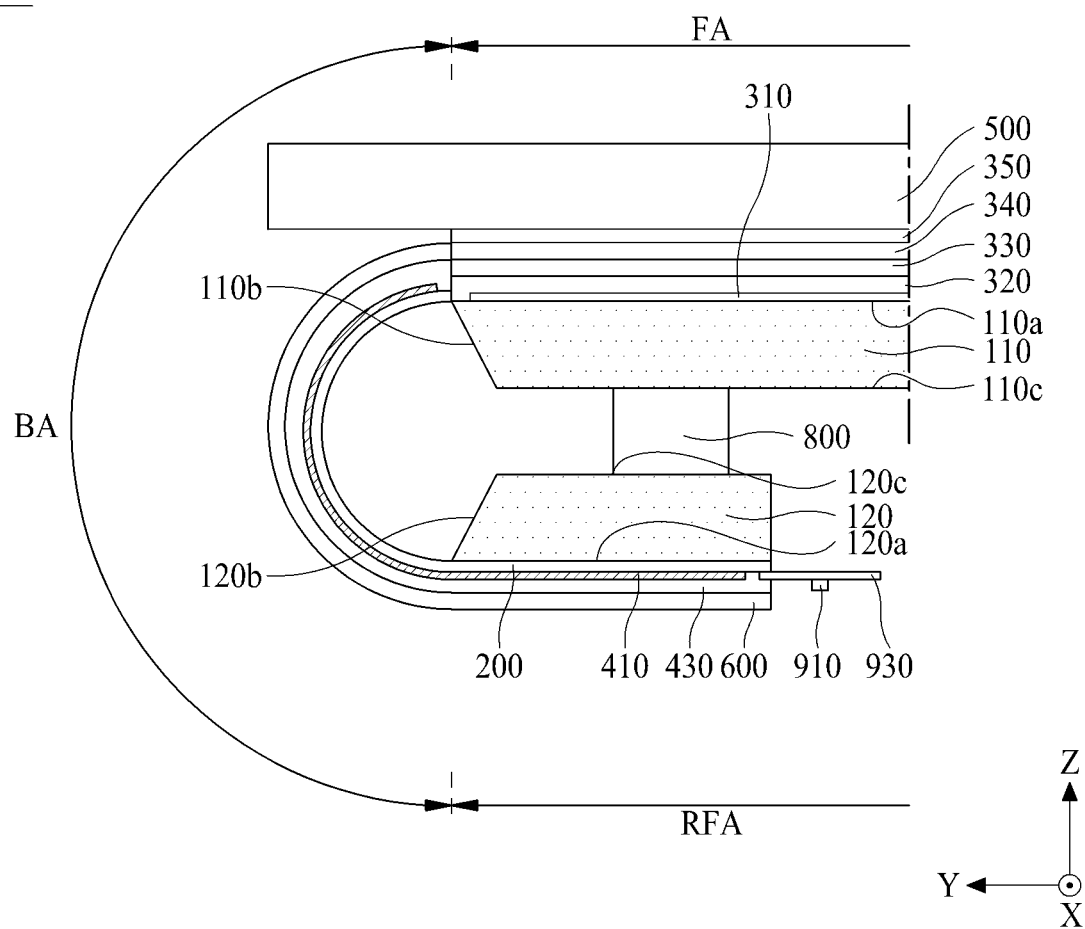
FIG. 6a is another cross-sectional view taken along line shown in FIG. 4.
Figure 6B:
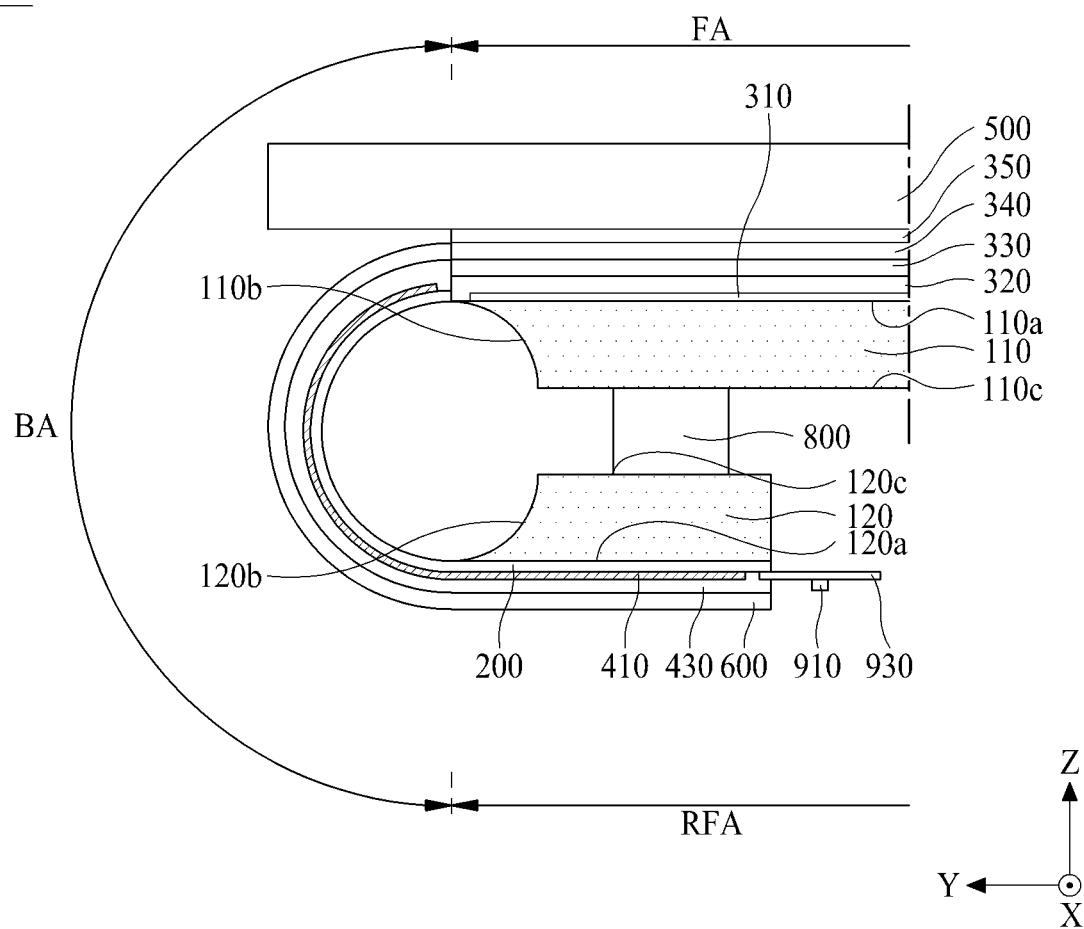
FIG. 6b is still another cross-sectional view taken along line II-IF shown in FIG. 4.
Figure 6C:
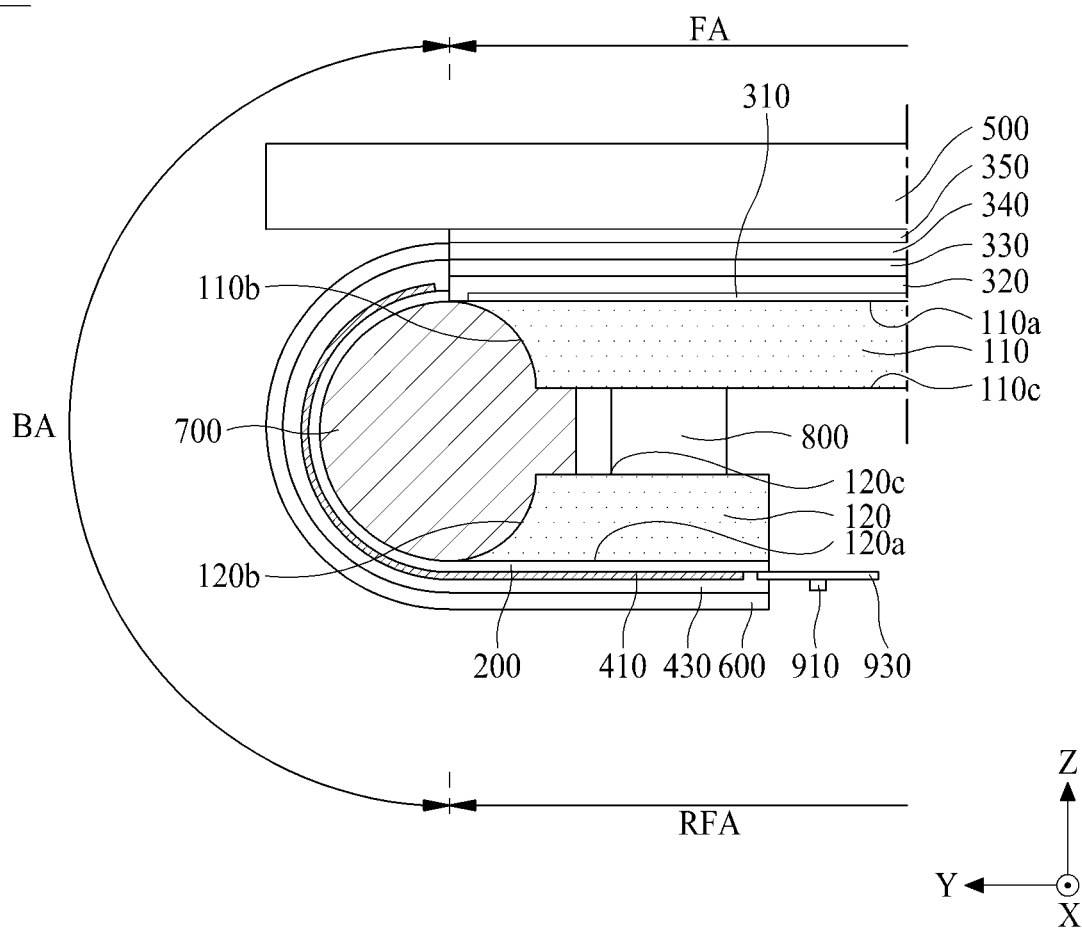
FIG. 6c is further still another cross-sectional view taken along line II-IF shown in FIG. 4.
Figure 6D:
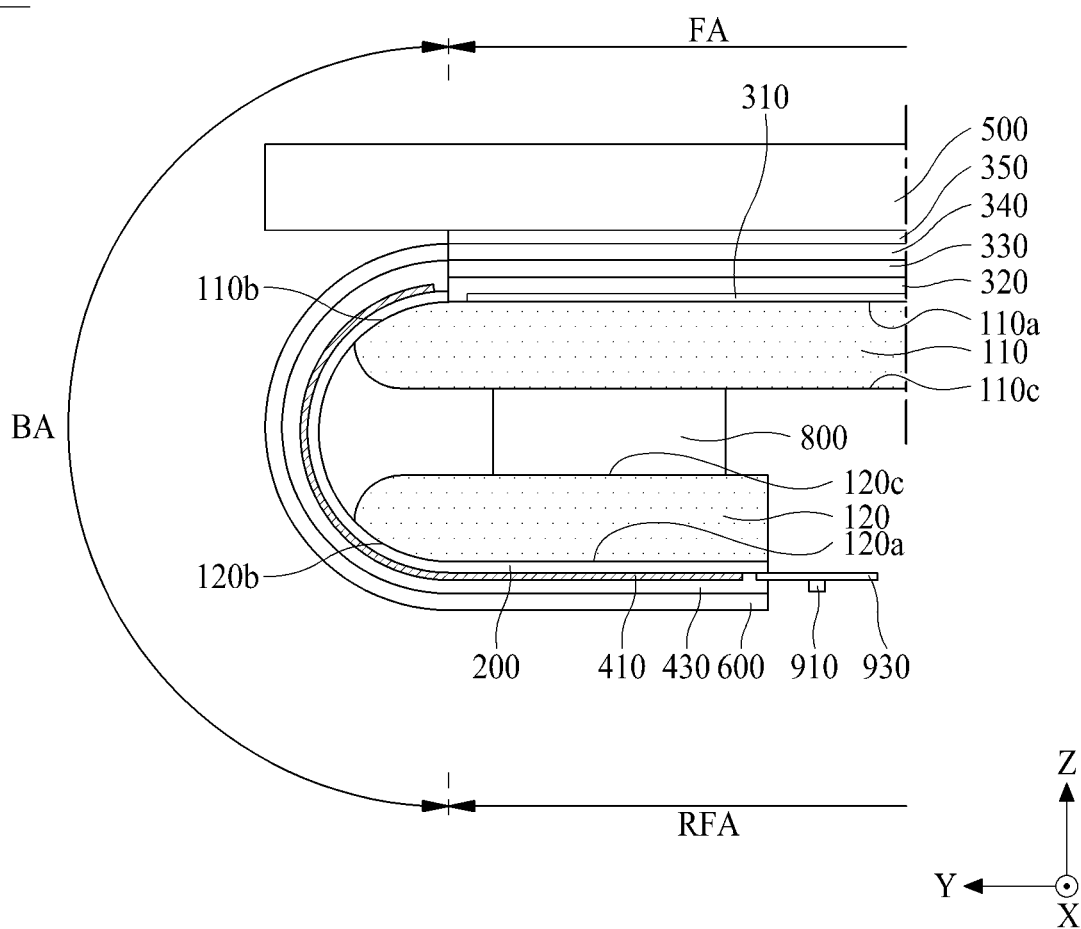
FIG. 6d is further still another cross-sectional view taken along line II-IF shown in FIG. 4.

FIG. 6a is another cross-sectional view taken along line shown in FIG. 4, FIG. 6b is still another cross-sectional view taken along line II-IF shown in FIG. 4, FIG. 6c is further still another cross-sectional view taken along line II-IF shown in FIG. 4, and FIG. 6d is further still another cross-sectional view taken along line II-IF shown in FIG. 4.

Referring to FIGS. 6a to 6d, the first etching surface 110b of the first glass substrate 110 and the second etching surface 120b of the second glass substrate 120 may have a forward tapered shape and a curved surface, and may be provided not to be in contact with the anti-etching member 200.

The first etching surface 110*b* of the first glass substrate 110 and the second etching surface 120*b* of the second glass substrate 120 according to one embodiment of the present disclosure may be formed by a glass etching process according to a soft etch condition. In this case, the soft etch condition may be defined by a glass etching process performed for a time less than a reference etching time set to etch a glass of a certain thickness.

The first etching surface 110*b* of the first glass substrate 110 and the second etching surface 120*b* of the second glass substrate 120 may be formed in such a manner that a mask pattern is formed on a rear surface of a glass substrate (not shown) overlapped with the other areas FA and RFA except the bending area BA and then an area of the glass substrate overlapped with the bending area BA is etched in an oblique shape by the glass etching process using the mask pattern as a mask based on the soft etch condition. In this case, the glass substrate (not shown) means a glass substrate before the first glass substrate 110 and the second glass substrate 120 are detached from each other by the glass etching process.

The first etching surface 110*b* of the first glass substrate 110 and the second etching surface 120*b* of the second glass substrate 120 may be formed as inclined surfaces having a convex curved shape or linear shape. In this case, sectional areas of the first etching surface 110*b* of the first glass substrate 110 and the second etching surface 120*b* of the second glass substrate 120 may be reduced as these etching surfaces become far away from the first flat surface 110*a* and the second flat surface 120*a*. For example, the sectional areas of the first etching surface 110*b* of the first glass substrate 110 and the second etching surface 120*b* of the second glass substrate 120 may be defined by a size of a horizontal cutting surface cut based on a horizontal surface parallel with the first flat surface 110*a* and the second flat surface 120*a*. The first etching surface 110*b* and the second etching surface 120*b* may be designated to have a forward tapered shape.

As shown in FIGS. 6*a* to 6*c*, the first etching surface 110*b* of the first glass substrate 110 and the second etching surface 120*b* of the second glass substrate 120 according to one embodiment of the present disclosure may have a forward tapered structure, and therefore may not be in contact with the anti-etching member 200. Also, as shown in FIG. 6*c*, the display apparatus may further comprise an elastic member 700 provided below the anti-etching member 200.

Referring to FIG. 6*d*, the first etching surface 110*b* of the first glass substrate 110 and the second etching surface 120*b* of the second glass substrate 120 may have rounded-edge ends or stumpy ends which are not sharp. The structure of the first etching surface 110*b* of the first glass substrate 110 and the second etching surface 120*b* of the second glass substrate 120 having rounded-edge ends or stumpy ends may be a structure that a stress is slowly dispersed when supporting the anti-etching member 200, whereby reliability of the display apparatus may be improved. Also, although FIG. 6*d* shows that the elastic member 700 is not deposited between the first and second etching surfaces 110*b* and 120*b* and the anti-etching member 200, the elastic member 700 may be provided to fill a fine gap between the first and second etching surfaces 110*b* and 120*b* and the anti-etching member 200.

Figure 7:
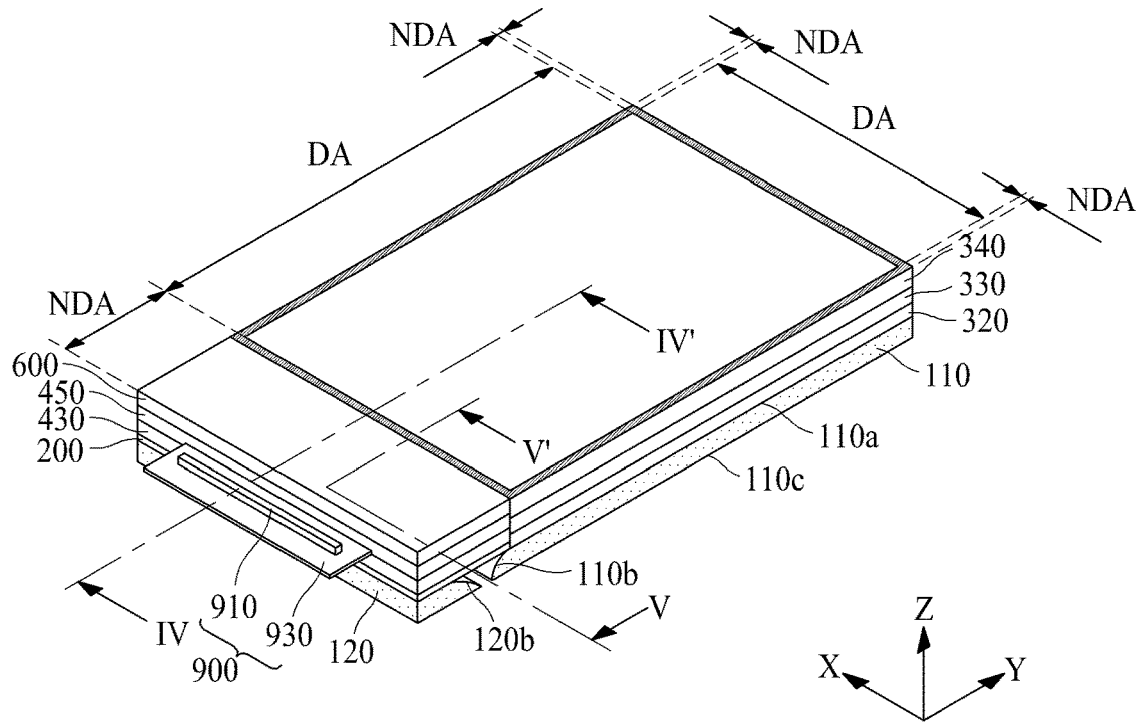
FIG. 7 is a perspective view illustrating a display apparatus according to one embodiment of the present disclosure.
Figure 8:
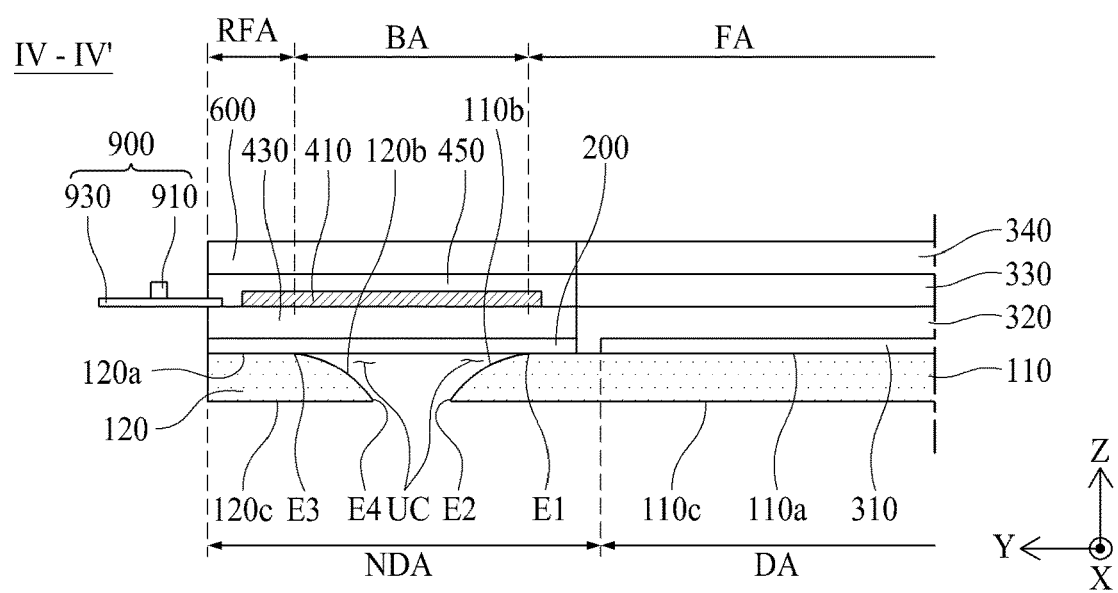
FIG. 8 is a cross-sectional view taken along line IV-IV' shown in FIG. 7.

FIG. 7 is a perspective view illustrating a display apparatus according to one embodiment of the present disclosure, and FIG. 8 is a cross-sectional view taken along line IV-IV' shown in FIG. 7. Since the display apparatus of FIGS. 7 and 8 is the same as the display apparatus of FIGS. 1 to 6 except that structures of a non-display area and a bending area are modified, a repeated description will be omitted.

Referring to FIGS. 7 and 8, the display apparatus according to one embodiment of the present disclosure comprises a first glass substrate 110 provided in a display area DA, a second glass substrate 120 provided in a non-display area NDA, an anti-etching member 200 provided to overlap a bending area BA, and a link line portion 410 formed on the anti-etching member 200 and formed to overlap the non-display area NDA, wherein the link line portion 410 may further include a first planarization layer 430 arranged on the anti-etching member 200 of the non-display area NDA and a second planarization layer 450 arranged on the first planarization layer 430.

The first planarization layer 430 may be formed of the same material as that of a planarization layer constituting the pixel array layer 310 of the display area DA by the same process and identified from the planarization layer by patterning, but may be formed of another material without limitation to the above example. The first planarization layer 430 may be made of an organic based insulating material such as photo acryl or BCB.

The second planarization layer 450 may be formed of, but not limited to, the same thickness and the same material as those of the first planarization layer 430. For example, the first planarization layer 430 may be formed at a first thickness, and the second planarization layer 450 may be formed at a second thickness, wherein the first thickness and the second thickness may be different from each other.

At this time, the link line portion 410 may be provided between the first planarization layer 430 and the second planarization layer 450. In detail, the link line portion 410 may be provided on the first planarization layer 430. Also, the flexible circuit film 930 of the panel driving circuit 900 may be provided on the first planarization layer 430.

The anti-etching member 200 may include at least one of Cr, Al, Pt, Au and Ni.

At this time, if the anti-etching member 200 is provided with a metal that includes at least one of Cr, Al, Pt, Au and Ni and arranged to be in contact with the link line portion 410 formed on the anti-etching member 200, a problem of driving of the link line portion may occur. Therefore, the link line portion 410 may be formed on the first planarization layer 430 and spaced apart from the anti-etching member 200.

Figure 9A:
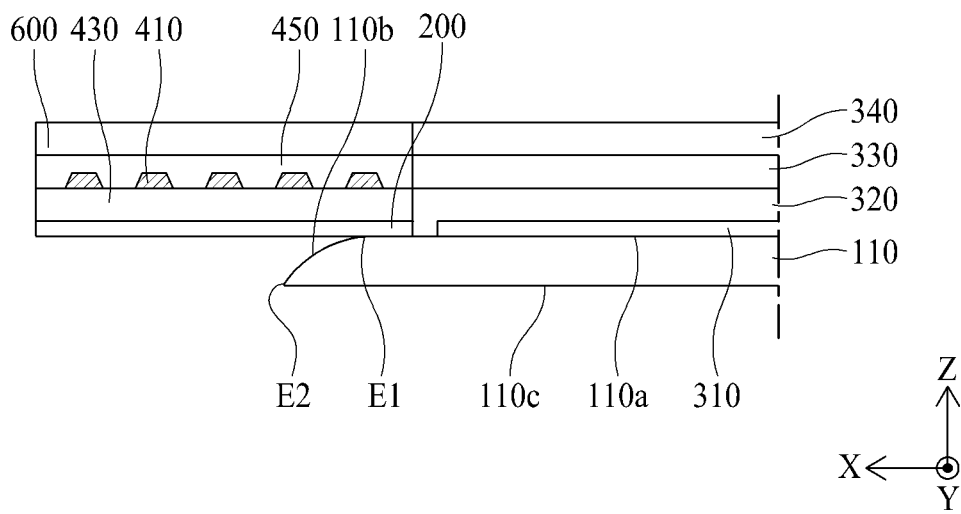
FIG. 9a is a cross-sectional view taken along line V-V' shown in FIG. 7.
Figure 9B:
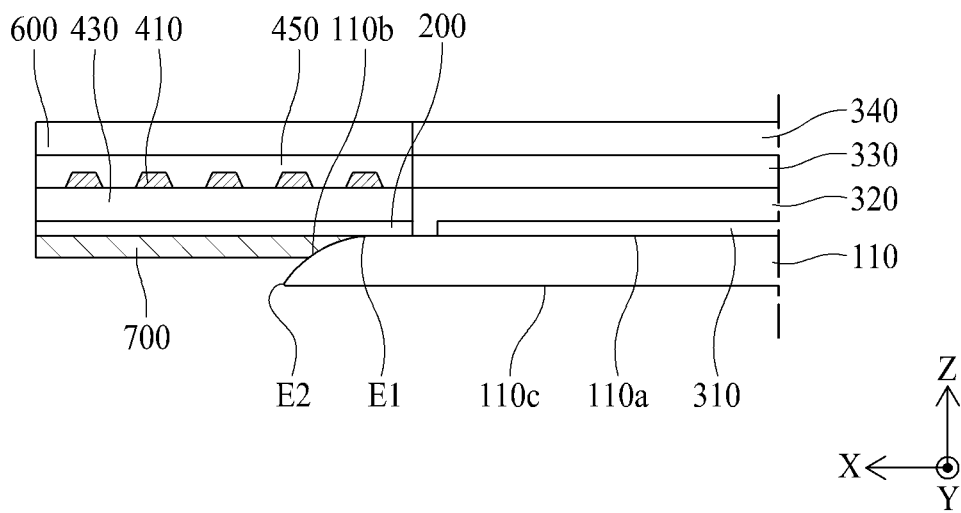
FIG. 9b is another cross-sectional view taken along line V-V' shown in FIG. 7.

FIG. 9*a* is a cross-sectional view taken along line V-V' shown in FIG. 7, and FIG. 9*b* is another cross-sectional view taken along line V-V' shown in FIG. 7.

Referring to FIG. 9*a*, the link line portion 410 may be arranged on the first planarization layer 430, and the second planarization layer may be arranged on the first planarization layer 430 and the link line portion 410. Therefore, the link line portion 410 may be formed on the first planarization layer 430 and spaced apart from the anti-etching member 200. In this way, a structure that the planarization layers of two layers are formed may be applied to the non-display area of the display apparatus according to one embodiment of the present disclosure. Therefore, although the structure that the planarization layers of two layers are formed may be applied to the display area of the display apparatus according to one embodiment of the present disclosure, the embodiment of the present disclosure is not limited to this example because the structure of the display area DA and the structure of the non-display area NDA may be formed to be different from each other.

Figure 10:
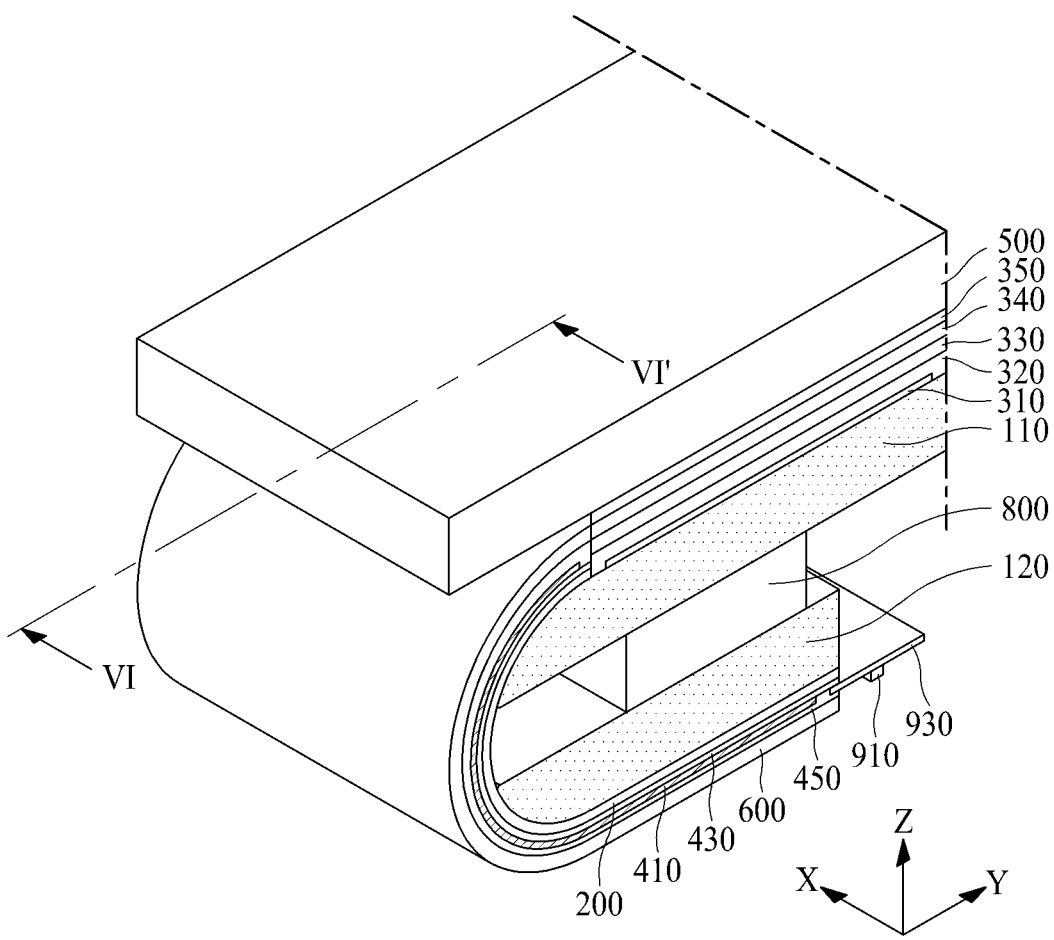
FIG. 10 is a perspective view illustrating a display apparatus according to one embodiment of the present disclosure.
Figure 11:
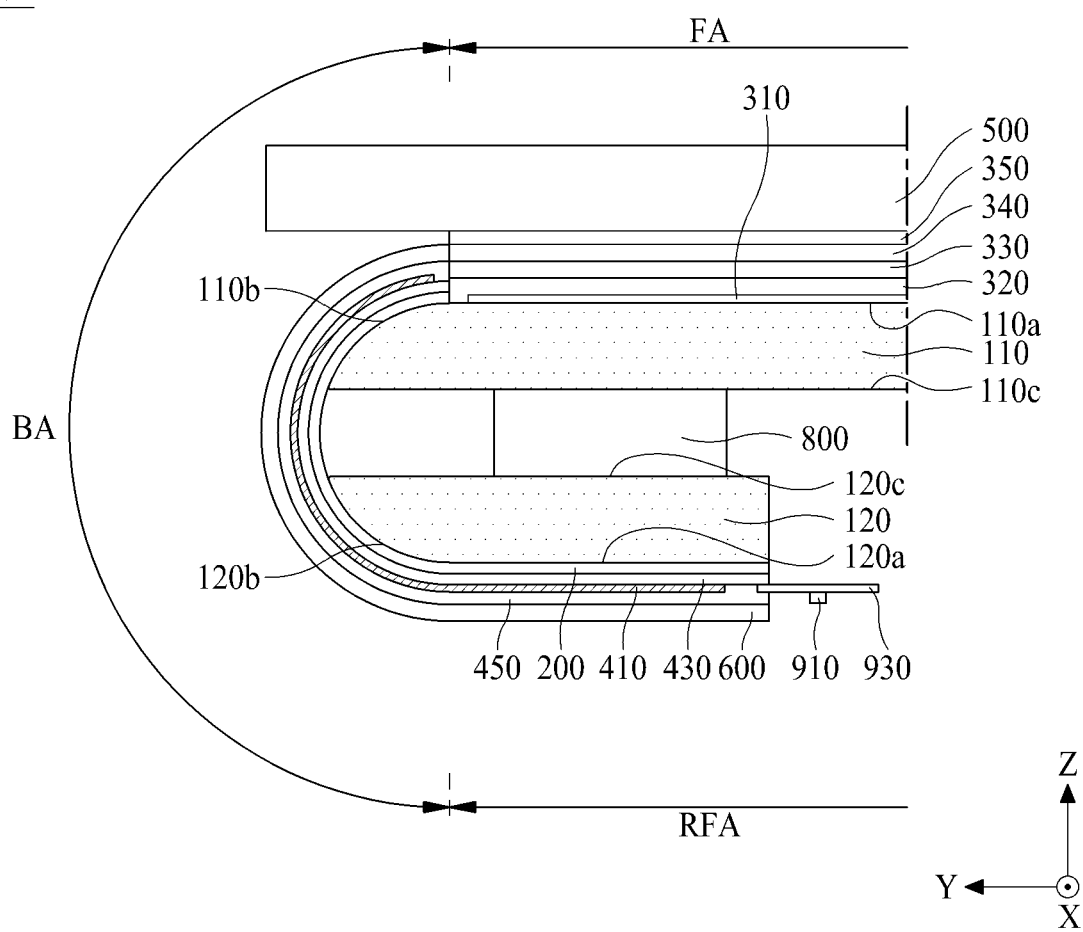
FIG. 11 is a cross-sectional view taken along line VI-VI' shown in FIG. 10.

FIG. 10 is a perspective view illustrating a display apparatus according to one embodiment of the present disclosure, and FIG. 11 is a cross-sectional view taken along line VI-VI' shown in FIG. 10. Since the display apparatus of FIGS. 10 and 11 is the same as the display apparatus of FIGS. 4 and 6a except that a structure of a non-display area is modified, a repeated description will be omitted.

As shown in FIGS. 10 and 11, the link line portion 410 may be arranged on the first planarization layer 430, and the second planarization layer 450 may be arranged on the first planarization layer 430 and the link line portion 410. Therefore, a structure that the planarization layers of two layers are formed may be applied to the non-display area of the display apparatus according to one embodiment of the present disclosure. Therefore, although the structure that the planarization layers of two layers are formed may be applied to the display area of the display apparatus according to one embodiment of the present disclosure, the embodiment of the present disclosure is not limited to this example because the structure of the display area DA and the structure of the non-display area NDA may be formed to be different from each other.

Also, the structure of the first etching surface 110b of the first glass substrate 100 and the second etching surface 120b and the second etching surface 120b of the second glass substrate 120 in FIGS. 5 and 6 may be applied to the structure of the first etching surface 110b of the first glass substrate 100 and the second etching surface 120b and the second etching surface 120b of the second glass substrate 120 in FIG. 11.

The display apparatus according to one embodiment of the present disclosure may be described as follows.

A display apparatus according to one embodiment of the present disclosure relates a to display apparatus comprising a display area, a non-display area surrounding the display area, and a bending area formed in at least one side of the non-display area, and comprises a first glass substrate provided in the display area, a second glass substrate provided in the non-display area, an anti-etching member provided to overlap the bending area, and a link line portion formed on the anti-etching member and formed to overlap the non-display area.

According to some embodiments of the present disclosure, the first glass substrate may include a first etching surface provided to overlap the bending area.

According to some embodiments of the present disclosure, the second glass substrate may include a second etching surface provided to overlap the bending area.

According to some embodiments of the present disclosure, the anti-etching member may include a metal or an organic matter.

According to some embodiments of the present disclosure, the anti-etching member may include at least one of silicone based organic matter, urethane, polyimide and photo acryl.

According to some embodiments of the present disclosure, the anti-etching member may include at least one of Cr, Al, Pt, Au and Ni.

According to some embodiments of the present disclosure, the display apparatus may further comprise a first planarization layer covering the link line portion.

According to some embodiments of the present disclosure, the display apparatus may further comprise a first planarization layer arranged between the anti-etching member and the link line portion, and a second planarization layer arranged on the first planarization layer, wherein the link line portion may be arranged on the first planarization layer.

According to some embodiments of the present disclosure, the display apparatus may further comprise an elastic member arranged below the anti-etching member.

According to some embodiments of the present disclosure, the elastic member may have an elongation rate of 100% or more.

A display apparatus according to one embodiment of the present disclosure relates to a display apparatus comprising a display area, a non-display area surrounding the display area, and a bending area formed in at least one side of the non-display area, and may comprise a first glass substrate provided in the display area, a second glass substrate provided in the non-display area, an anti-etching member provided to overlap the bending area, a first planarization layer provided to cover the anti-etching member, a link line portion partially arranged on the first planarization layer, and a second planarization layer provided to cover the link line portion and the first planarization layer.

According to some embodiments of the present disclosure, the anti-etching member may include a metal or an organic matter.

According to some embodiments of the present disclosure, the anti-etching member may include at least one of silicone based organic matter, urethane, polyimide and photo acryl.

According to some embodiments of the present disclosure, the anti-etching member may include at least one of Cr, Al, Pt, Au and Ni.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus comprising a display area, a non-display area surrounding the display area, and a bending area formed in at least one side of the non-display area, the display apparatus comprising:
   a first glass substrate provided in the display area;
   a second glass substrate provided in the non-display area;
   an anti-etching member provided to overlap the bending area; and
   a link line portion formed on the anti-etching member and formed to overlap the non-display area.

2. The display apparatus of claim 1, wherein the first glass substrate includes a first etching surface provided to overlap the bending area.

3. The display apparatus of claim 1, wherein the second glass substrate includes a second etching surface provided to overlap the bending area.

4. The display apparatus of claim 1, wherein the anti-etching member includes a metal or an organic matter.

5. The display apparatus of claim 1, wherein the anti-etching member includes at least one of silicone based organic matter, urethane, polyimide and photo acryl.

6. The display apparatus of claim 1, wherein the anti-etching member includes at least one of Cr, Al, Pt, Au and Ni.

7. The display apparatus of claim 1, further comprising a first planarization layer covering the link line portion.

8. The display apparatus of claim 1, further comprising:
a first planarization layer arranged between the anti-etching member and the link line portion; and
a second planarization layer arranged on the first planarization layer,
wherein the link line portion is arranged on the first planarization layer.

9. The display apparatus of claim 1, further comprising an elastic member arranged below the anti-etching member.

10. The display apparatus of claim 9, wherein the elastic member has an elongation rate of 100% or more.

11. A display apparatus comprising a display area, a non-display area surrounding the display area, and a bending area formed in at least one side of the non-display area, the display apparatus comprising:
a first glass substrate provided in the display area;
a second glass substrate provided in the non-display area;
an anti-etching member provided to overlap the bending area;
a first planarization layer provided to cover the anti-etching member;
a link line portion partially arranged on the first planarization layer; and
a second planarization layer provided to cover the link line portion and the first planarization layer.

12. The display apparatus of claim 11, wherein the anti-etching member includes a metal or an organic matter.

13. The display apparatus of claim 11, wherein the anti-etching member includes at least one of silicone based organic matter, urethane, polyimide and photo acryl.

14. The display apparatus of claim 11, wherein the anti-etching member includes at least one of Cr, Al, Pt, Au and Ni.

* * * * *